(12) United States Patent
Pornin et al.

(10) Patent No.: US 9,199,839 B2
(45) Date of Patent: Dec. 1, 2015

(54) METHOD OF HERMETICALLY SEALING A HOLE WITH A FUSE MATERIAL

(71) Applicants: COMMISSARIAT A L'ENERGIE ATOMIQUE ET AUX ENE ALT, Paris (FR); EPCOS AG, Munich (DE)

(72) Inventors: Jean-Louis Pornin, Crolles (FR); Arnoldus Den Dekker, Beuningen (NL); Marcel Giesen, Munich (DE); Florent Greco, Seyssins (FR); Gudrun Henn, Ebenhausen (DE); Bruno Reig, Moirans (FR); Damien Saint-Patrice, Chabeuil (FR)

(73) Assignees: Commissariat à l'énergie atomique et aux énergies alternatives, Paris (FR); EPCOS AG, Munich (DE)

( * ) Notice: Subject to any disclaimer, the term of this patent is extended or adjusted under 35 U.S.C. 154(b) by 0 days.

(21) Appl. No.: 14/551,701

(22) Filed: Nov. 24, 2014

(65) Prior Publication Data
US 2015/0158725 A1 Jun. 11, 2015

(30) Foreign Application Priority Data
Dec. 6, 2013 (WO) .................. PCT/IB2013/002989

(51) Int. Cl.
*H01L 21/00* (2006.01)
*B81C 1/00* (2006.01)

(52) U.S. Cl.
CPC ..... *B81C 1/00293* (2013.01); *B81C 2203/0145* (2013.01)

(58) Field of Classification Search
CPC ................. H01L 2924/00; H01L 2224/45144; H01L 2924/1461; H01L 23/481; H01L 29/2003; H01L 21/02126; H01L 21/02236; H01L 21/02252; H01L 21/32125; H01L 21/3221; H01L 21/486; H01L 21/56; H01L 21/565
USPC .................. 257/434, 704, 778, 676, E23.031, 257/E21.508; 438/108, 118, 613
See application file for complete search history.

(56) References Cited

U.S. PATENT DOCUMENTS

| | | | |
|---|---|---|---|
| 5,107,078 A | 4/1992 | Marion et al. | |
| 2005/0067688 A1* | 3/2005 | Humpston | 257/704 |

(Continued)

FOREIGN PATENT DOCUMENTS

| | | |
|---|---|---|
| EP | 0 414 594 A1 | 2/1991 |
| EP | 1 433 741 A2 | 6/2004 |

(Continued)

OTHER PUBLICATIONS

International Search Report issued Jun. 12, 2014, in International Application No. PCT/IB2013/002989 filed Dec. 6, 2013.

*Primary Examiner* — Mark A Laurenzi
(74) *Attorney, Agent, or Firm* — Oblon, McClelland, Maier & Neustadt, L.L.P.

(57) ABSTRACT

Method of hermetically sealing a hole with a fuse material, comprising the following steps: applying a portion of wettable material onto a surface such that it completely surrounds the hole made through said surface and is located outside the hole, or completely surrounds a first part of said surface corresponding to a location of the hole; applying a portion of fuse material on the portion of wettable material and on a second part of said surface located around the portion of wettable material; reflowing the portion of fuse material to form a bump of fuse material which has a shape corresponding to a part of a sphere, which is fastened only to the portion of wettable material and which hermetically plugs the hole; wherein the hole is made in said surface before reflowing the portion of fuse material.

19 Claims, 9 Drawing Sheets

(56) References Cited

U.S. PATENT DOCUMENTS

| | | |
|---|---|---|
| 2007/0218585 A1 | 9/2007 | Robert |
| 2007/0235501 A1 | 10/2007 | Heck |
| 2008/0296717 A1* | 12/2008 | Beroz et al. ............... 257/434 |
| 2009/0154872 A1* | 6/2009 | Sherrer et al. ............. 385/14 |
| 2010/0003789 A1 | 1/2010 | Caplet et al. |
| 2010/0190301 A1 | 7/2010 | Delapierre et al. |
| 2011/0114840 A1 | 5/2011 | Yamazaki et al. |
| 2011/0219612 A1 | 9/2011 | Jacquet et al. |
| 2011/0278716 A1* | 11/2011 | Hsu et al. ................ 257/737 |
| 2012/0164787 A1 | 6/2012 | Moon et al. |
| 2012/0256308 A1 | 10/2012 | Helin |
| 2013/0043573 A1* | 2/2013 | Williams et al. ........... 257/676 |
| 2013/0207281 A1 | 8/2013 | Baillin et al. |

FOREIGN PATENT DOCUMENTS

| | | |
|---|---|---|
| FR | 2 898 597 A1 | 9/2007 |
| WO | WO 01/58804 A2 | 8/2001 |

* cited by examiner

METHOD OF HERMETICALLY SEALING A HOLE WITH A FUSE MATERIAL

TECHNICAL FIELD AND PRIOR ART

The invention relates a method of hermetically sealing, or plugging or closing, a hole with a fuse material, also called fusible material or solder. Advantageously, the method according to the invention is carried out during a packaging process in order to encapsulate one or several microelectronic devices, like MEMS and/or MOEMS and/or NEMS and/or NOEMS devices, or any other device such that an acoustic-type or a sensor-type device, in one or several cavities.

A wide variety of microelectronic devices, especially MEMS devices, have to be hermetically packaged to maintain a certain atmosphere around the devices to secure reliable operation and/or operation within specifications. A number of MEMS devices, for example RF-MEMS switches, need an inert gas at a specified pressure greater than around 100 mbar to generate sufficient damping force to minimize ringing effects when such devices are in an open state and/or to generate a squeeze-film damping force when the switches close to minimize the force of the impact of the closure.

Two different possibilities are known for making such packaging. A first well known possibility named cap report consists of creating a cavity by micromachining in a cap wafer, for example silicon-based, reporting it above a support wafer on which at least one microelectronic device is arranged and performing a bonding process between the cap wafer and the support wafer.

This bonding step can be performed at controlled atmosphere (control of the pressure and of the nature of gas of the atmosphere) in order to obtain the controlled atmosphere in the closed cavity in which the microelectronic device is encapsulated.

Thin Film Capping (also named TFP for "Thin Film Packaging") is a technology which enables to decrease package height, area and cost compared to a cap report packaging. In a TFP process, a cap is obtained with the deposition of one or several thin layers above a sacrificial layer which is then etched through holes made in the cap in order to form a cavity in which the device is encapsulated. With this technology, the challenge is to close the holes that are performed for the sacrificial layer release. A polymer layer can be used to close the holes by depositing this polymer layer above the cap. However, in this case the obtained pressure corresponds to the atmospheric pressure, and oxygen, water, and organic gas are present inside the cavity because the cavity atmosphere cannot be managed independently during the deposition process of the polymer layer (e.g., spin-on process or film lamination process). Thus hermetic cavities with pressures over around 100 mbar at room temperature and with a controlled nature of gases inside the cavities could not be made with such technology. Moreover if the closing process involves the deposition of a plugging layer for example of PVD (Physical Vapor Deposition), CVD (Chemical Vapor Deposition) or PECVD (Plasma Enhanced Chemical Vapor Deposition) type, the gases caught inside the cavity, like silane or TEOS for PECVD processes, could decrease the performances and/or the reliability of such packaging.

Documents EP 1 433 741 A2, US 2012/0256308 A1 and US 2010/0190301 A1 disclose the use of a fuse material to close holes made trough a film. However, the processes disclosed in these documents involves the use of a large area on the cap for each hole to plug, and/or the use of a specific material to decrease the size of the holes before plugging the hole, and/or the use of another wafer to support the fuse material on the cap. Moreover, none of these processes enables to obtain a good closure of the holes with the fuse material.

DESCRIPTION OF THE INVENTION

Thus there is a need to propose a new sealing, or plugging, process of at least one hole with a fuse material which reduces the necessary area to close the hole while enabling a good closure of the hole by the fuse material, and which does not involve the use of another wafer to report the solder material and/or the use of a specific material to decrease the size of the hole before the hermetically plugging of the hole.

One embodiment provides a method of hermetically sealing at least one hole with a fuse material, comprising at least the following steps:
  applying a portion of wettable material on a surface such that the portion of wettable material completely surrounds the hole made in or through said surface and that all the wettable material is located outside the hole, or such that the portion of wettable material completely surrounds a first part of said surface corresponding to a location of the hole intended to be made;
  applying at least a portion of fuse material on at least a part of the portion of wettable material, and on at least one second part of said surface adjacent or around the portion of wettable material such that a part of the portion of fuse material is arranged next to the portion of wettable material but is in contact with the portion of wettable material, a volume of the portion of fuse material corresponding to a volume of a bump of fuse material intended to hermetically plug the hole;
  reflowing the portion of fuse material to form a bump of fuse material which has a shape corresponding to a part of a sphere, which is fastened, attached or tied only to the portion of wettable material and which hermetically plugs the hole;
wherein the hole is made in or through at least said surface before the reflowing of the portion of fuse material.

Also disclosed is a method of hermetically sealing at least one hole in a surface with a fuse material, comprising at least the following steps:
  applying a portion of wettable material on the surface such that the portion of wettable material completely surrounds the hole made in or through said surface, or completely surrounds a first part of said surface corresponding to a location of the hole intended to be made;
  applying at least a portion of fuse material on at least a part of the portion of wettable material and on at least one second part of said surface located around the portion of wettable material, such that a volume of the portion of fuse material corresponds to a volume of a bump of fuse material intended to hermetically plug the hole;
  reflowing the portion of fuse material to form a bump of fuse material which has a shape corresponding to a part of a sphere, which is fastened, or attached or tied, only to the portion of wettable material and which hermetically plugs the hole;
wherein the hole is made through at least said surface before reflowing the portion of fuse material.

This method thus proposes to apply a portion of wettable material on an area of the surface around the hole, for example formed like a ring or an annulus, and to apply a portion of fuse material on the portion of wettable material but also around this portion of wettable material (i.e. on a second part of the surface). With such an arrangement, and given that the portion of wettable material completely surrounds the hole, the reflow of the portion of fuse material thus creates a bump of fuse material plugging the hole with a good tightness. Forming of the bump is driven by the surface tension of the reflowed fuse material and the adhesion force of the wettable material and the reflowed fuse material in connection with the repelling force of the non-wettable remaining surface.

Moreover, with this method, the volume of fuse material can be chosen to enable a complete closing the hole without reducing previously the size of the hole. Finally, such method does not use a wafer to transfer the portion of fuse material.

The area around the hole deposited with wettable material and the volume of the portion of fuse material define the shape of the bump. In an ideal case the wetting angle of the fuse material on the surface is corresponding to the angle between the shape of the bump and the surface. Only the area of wettable material is in contact with the bump and hence, the bump only adheres to the wettable material.

In addition, as the wettable material is located outside the hole, the obtained bump of fuse material keeps also being located outside the hole, without blocking or filling the volume of the hole. One advantage is to minimize or avoid a capacitive effect between the bump and any conductive layer below the bump, and cross talk between RF conductive layers below the bump. In case of a thin layer (102) between wettable layer and conductive layer another risk is a short circuit between bump and this conductive layer. In case of a hole free fuse material the distance between the conductive layers and the bump is at least the membrane (102) thickness.

The fuse material corresponds to a fusible metal or a fusible alloy, that is a metal or metal alloy capable of being easily fused, i.e. easily meltable, at relatively low temperatures which are compatible with microelectronic processes. The value of the melting point of the fuse material depends on the nature of the fuse material. The fuse material may have a melting point, for example, between around 300° C. and 400° C. The fuse material may be an eutectic alloy and may be reflowed with a fluxless process.

The portion of wettable material completely surrounds the hole made through the surface or, if the hole is not made through the surface before the making of the portion of wettable material, completely surrounds the first part of the surface corresponding to the location of the hole intended to be made. Thus a shape of an outline of the portion of wettable material around the hole or around the first part of the surface is closed.

The volume of the portion of fuse material which is applied corresponds to the volume of the bump of fuse material which, after the reflow of the portion of fuse material, hermetically plugs the hole. Thus, the amount of fuse material which is made on the portion of wettable material and on the second part of the surface corresponds to the amount of fuse material forming the bump of fuse material, that is the amount of fuse material which is necessary to close the hole hermetically.

Figure 6A:
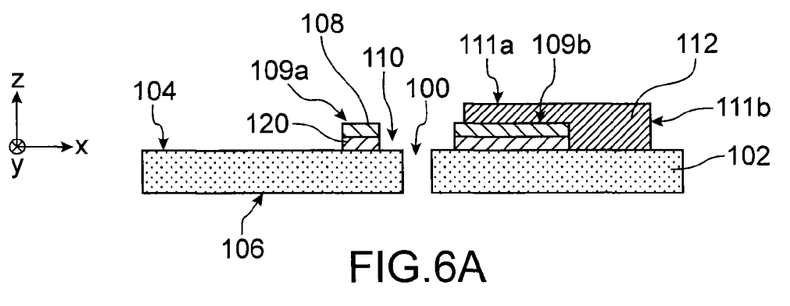
Figure 6B:
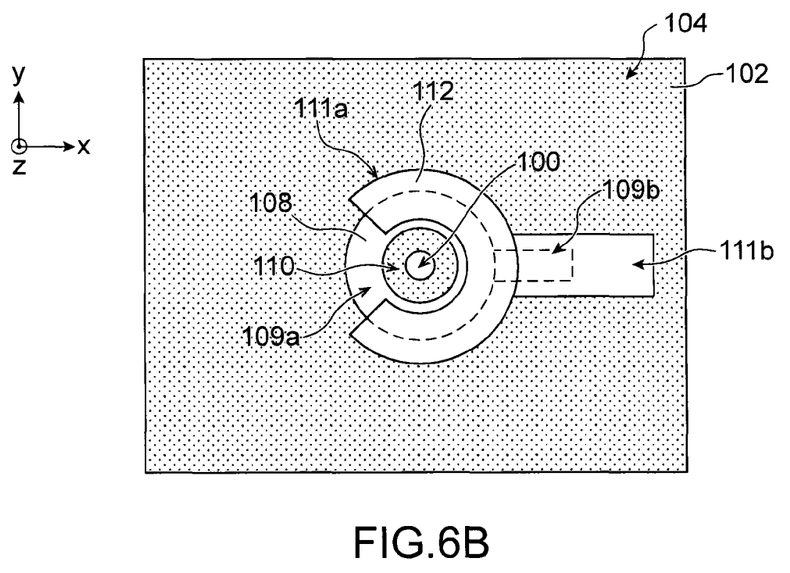

In addition, the portion of fuse material is initially made on at least a part of the portion of wettable material and also next to the portion of wettable material and is hence, distributed over a larger area than before. This avoids forming a shape of the portion of fuse material which is essentially vertical i.e. has a high aspect ratio greater than 1 and a main dimension substantially perpendicular to the surface onto which this portion is made which would be the case if the portion of fuse material would initially be deposited only on the portion of wettable material. The obtained portion of fuse material is more flat and hence, mechanically stronger than a vertical portion of fuse material, and it is thus easier to apply and shape this portion of fuse material. As an advantage this allows having a conductive metallization very close to the wettable material where the bump will be located. In this case, the fuse material can't be deposited outside of the wettable material near the conductive metallization but could extend the wettable material at another side of the hole. Another advantage is to allow an area of wettable material free of fuse material after deposition thereof (FIG. 6A & FIG. 6B). So the part of the volume of fuse material that is missing but necessary to form the bump could be deposited at the opposite side of this conductive metallization such that this area could be kept free of fuse material.

The wettable material could be similar to a material known for the upper layers of an UBM stack (Under Bump Metallization) used to form contacts for flip-chip technology. The wettable material may be defined in two points:

First, the area covered with wettable material is the area where the fuse material will be located after reflow, even if a part of the fuse material is deposited outside of it;

Secondly, the wettable material may be partially dissolved in the fuse material at reflow temperature, thus forming intermetallics and providing thereby the hermeticity and the attachment.

Generally, the wettable material may be a metal as, for example, gold, copper, platinum, or a stack of different materials, for example, TiNiAu or TiCu.

The portion of wettable material here corresponds to the surface to which the reflowed fuse material adheres after solidifying.

One or several individual and separated portions of fuse material may be made on the portion of wettable material and on the second part of the surface. In this case, during the reflowing of these portions of fuse material, the reflowed fuse material of these portions aggregates to form the bump of fuse material which plugs the hole.

The bump of fuse material may be in contact only with the portion of wettable material, but may also rest at least with a part of the portion on the surface located between the hole and the portion of wettable material and/or on a part of the surface located around the hole that may be free of the portion of wettable material.

In a plane parallel to the surface through which the hole is made, the shape of the portion of wettable material may be not directly linked to the shape of the hole or to the shape of the portion of fuse material, and the shape of the portion of fuse material may also be not directly linked to the shape of the hole. For instance, in this plane, it is possible to have the hole having a shape corresponding to a polygon like a hexagon, the portion of wettable material having a shape corresponding to a circular annulus made around the hole, and the portion of fuse material having a shape corresponding to a square frame covering a part of the portion of wettable material and also arranged around the portion of wettable material. Alternatively, the hole, the portion of wettable material and the portion of fuse material may have any other shape.

The hole may also not be centered on the surface which is completely surrounded by the portion of wettable material. Moreover, before the reflowing of the portion of fuse material, at least one part of the portion of wettable material is in contact with the portion of fuse material.

According to a particular embodiment, a shape of an outline of the portion of wettable material in a plane parallel to the surface on which the portion of wettable material is applied may correspond to the shape of the hole or to a shape of the first part of said surface in said plane. Thus, if the shape of the hole corresponds to a circle, the shape of the outline of the portion of wettable material may correspond to a circular annulus with inner diameters higher than those of the hole because the portion of wettable material is made around the hole or around the part of the surface corresponding to the location of the hole. If the shape of the hole corresponds to a polygon with a number of X sides (with X being an integer higher than 2), the shape of the outline of the portion of wettable material may also correspond to a polygonal annulus with X sides but with inner diameters higher than those of the hole. Moreover, the shape of the portion of fuse material may correspond to the shape of the portion of wettable material. This means the kind of geometry (e.g. circle, oval, polygon, etc.) of the portion of fuse material may be the same as the geometry of the portion of wettable material, but the portion of fuse material may have dimensions higher than those of the portion of wettable material.

The volume of the portion of fuse material may be such that the diameter of the obtained bump of fuse material is between around two and three times greater than the dimensions of the hole in the plane of said surface. Thus the volume of fuse material used to close the hole and the area covered by the wettable material and the fuse material on said surface once the hole is closed are optimized in order to avoid an excess of fuse material and/or the occupation of unnecessary area on said surface.

The parameters of the thermal cycle reflowing the portion of fuse material are such that the fuse material moves quickly during the reflowing and thus creating a dynamic getting in shape of the material. For example, the reflow process time may be in the range of one or two minutes at a temperature from about 30° to 40° above the melting point of the fuse material. The getting in shape corresponds to the change of the deposited shape to the reflowed shape of the fuse material (i.e. the form of the bump). In case of, for example, a circular shape, the deposited shape may be like a donut and the reflowed shape of the bump is a flatted sphere. Another goal of a fast reflow is to avoid oxidation in case of a fluxless process.

The shape of the portion of wettable material and/or the shape of the portion of fuse material and/or the shape of the hole in a plane parallel to said surface may be circular, polygonal, e.g., square, or slit.

The reflowing of the portion of fuse material may be carried out at a controlled atmosphere such that after the reflowing of the portion of fuse material the controlled atmosphere may correspond to the atmosphere at least in the hole. Thus it is possible to control the pressure and/or the nature of gas or gases in the hole and, if the hole is in communication with another closed space like a cavity, also in this closed space. The controlled pressure may be between $10^{-3}$ mbar and 1 bar, or higher than 1 bar.

The applying of the portion of wettable material may comprise the following steps:
  deposition of a layer of wettable material on said surface;
  etching a part of the layer of wettable material such that a remaining portion of the layer of wettable material corresponds to the portion of wettable material.

If the hole is made through said surface before the deposition of the layer of wettable material, the part of the layer of wettable material which may cover side walls and/or a bottom wall of the hole may also be etched. However, the hole may be advantageously made through the surface after the step of etching the part of the layer of wettable material. In this case, the hole may be made through the surface but also through the portion of wettable material.

An adhesion layer may be first deposited on said surface before the deposition of the layer of wettable material which is then deposited on said adhesion layer. Such adhesion layer can improve the deposition of the layer of wettable material.

If the hole is made through said surface before the deposition of the adhesion layer, the part of the adhesion layer which may cover side walls and/or a bottom wall of the hole may also be etched. However, the hole may be advantageously made through the surface after the deposition of the adhesion layer. In this case, the hole may be made through the surface but also through the adhesion layer.

The dimensions, e.g., the diameter, of the hole in the plane parallel to said surface may be equal or less than the inner dimensions, e.g., the inner diameter, of the portion of wettable material.

The portion of fuse material may be applied by electro-chemical deposition. The adhesion layer may form a seed layer for the growth of the fuse material during the electro-chemical deposition.

The applying of the portion of fuse material may comprise the following steps:
  deposition of a photo resist layer on said surface and on the portion of wettable material;
  etching a part of the photo resist layer to form an opening through the photo resist layer;
  forming the portion of fuse material in said opening by deposition at least in said opening. The photo resist layer may be removed (lift-off).

Said surface may correspond to a main surface of a layer, and the hole may be made through at least a part of the thickness of the layer.

In this case, said layer through which the hole is made may correspond to a wall of a cavity in which at least one microelectronic device is encapsulated, and/or to a membrane or a cap positioned over the cavity or enclosing the cavity. In this case, the reflowing of the portion of fuse material may be advantageously carried out at a controlled atmosphere, thus allowing to control the atmosphere in terms of pressure and/or choice of gases (pure or mix of several gases) in the cavity wherein the microelectronic device is encapsulated.

Alternately, the hole may correspond to a cavity in which at least one microelectronic device is encapsulated and the bump of fuse material may form a wall of the cavity like a lid. In this case, the reflowing of the portion of fuse material may be advantageously carried out at a controlled atmosphere.

BRIEF DESCRIPTION OF THE DRAWINGS

This invention will be understood easier view of the examples of embodiments provided purely for indicative and non-limiting purposes, in reference to the appended drawings wherein:

FIGS. 1A to 2B represent method steps of hermetically sealing a hole with a fuse material according to a first embodiment;

FIGS. 6A to 7B represent steps of a method of hermetically sealing a hole with a fuse material according to a fifth embodiment.

Identical, similar or equivalent parts of the different figures described below have the same numeric references for the sake of clarity between figures.

The different parts shown in the figures are not necessarily drawn to scale, so as to make the figures more comprehensible.

The different possibilities (alternatives and embodiments) must not be understood to mutually exclude each other and can, thus, be combined with each other.

DETAILED DESCRIPTION OF PARTICULAR EMBODIMENTS

Figure 1A:
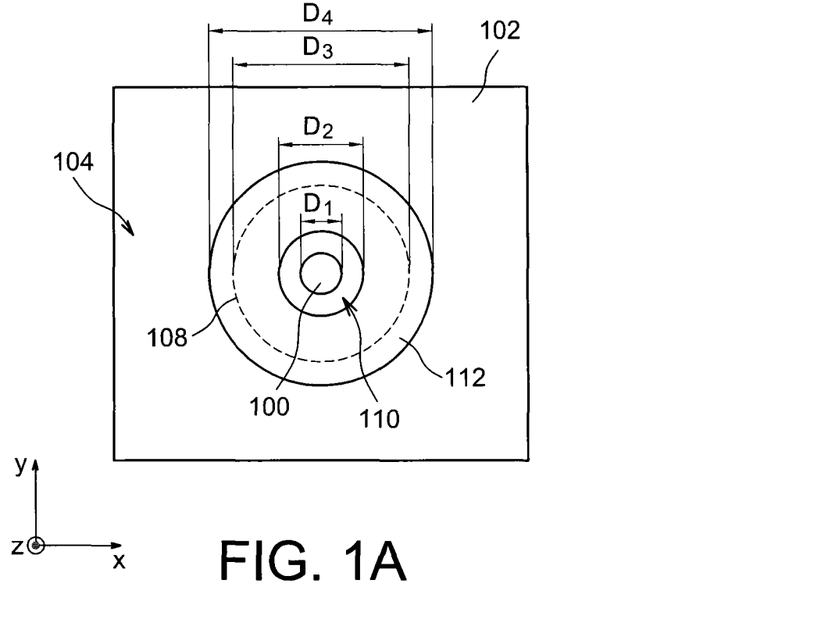
Figure 1B:
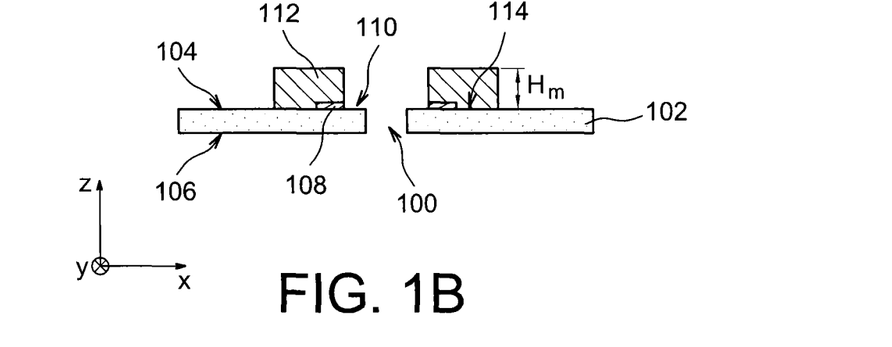
Figure 2A:
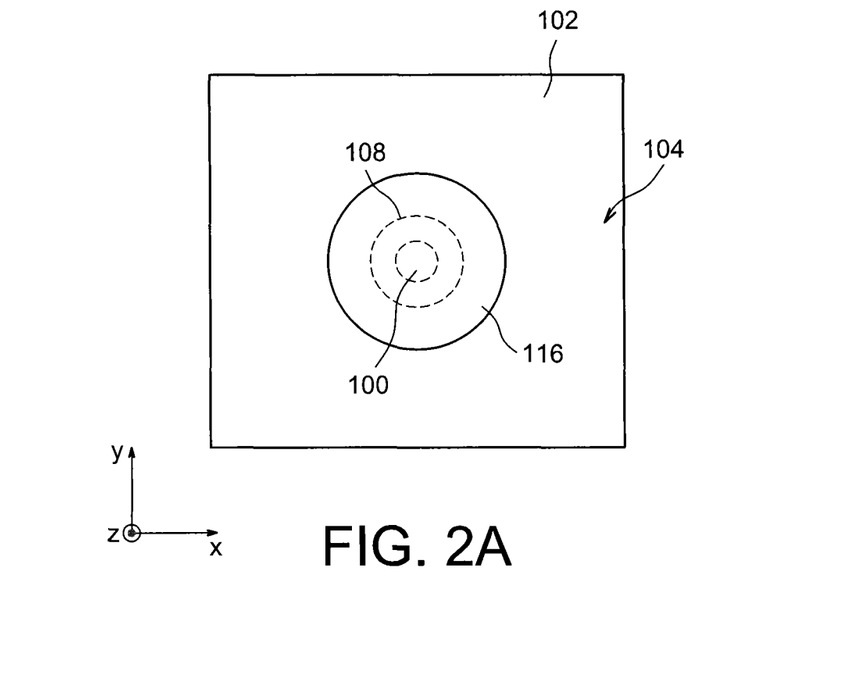
Figure 2B:
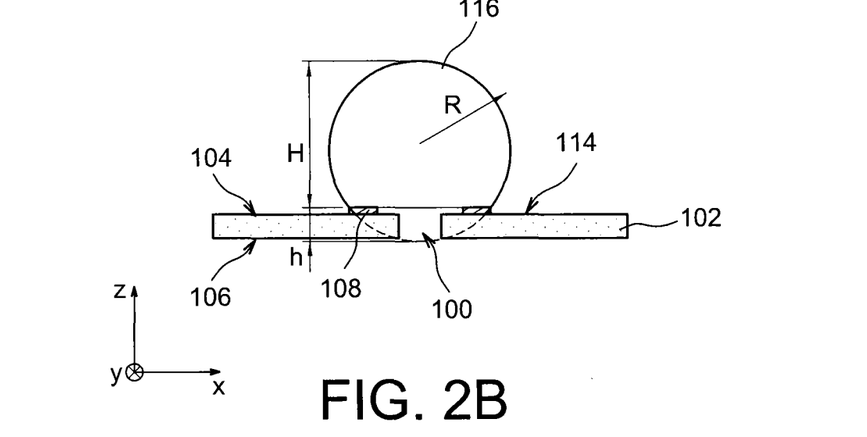

Reference is made to FIG. 1A to FIG. 2B which represent the steps of a method of hermetically sealing, or plugging, a hole with a fuse material according to a first embodiment. FIGS. 1A and 2A are top views and FIGS. 1B and 2B are respective cross-sectional views from the side.

As shown in FIGS. 1A and 1B, a hole 100 is made through at least a part of the thickness of a layer 102. In this Fig. and embodiment hole 100 is made through the entire thickness. The layer 102 comprises a surface 104, corresponding to a first main surface of the layer 102, on which a plug has to be made to hermetically close the hole 100. The first main surface is the face which is visible in FIGS. 1A and 2A, and a second main surface 106 is opposite to the first main face. A portion of wettable material 108 is made on the surface 104, around the hole 100 such that the portion of wettable material 108 completely surrounds the hole 100. The portion of wettable material 108 is not deposited inside the hole 100. In the first embodiment described here, the hole 100 is circular, that is it has, in a plane parallel to the surface 104, a cross-section corresponding to a circle of a diameter equal to D1. The portion of wettable material 108 is ring-shaped, or annulus-shaped, with an inner diameter equal to D2 which is equal or higher than D1, and an outer diameter D3 which is higher than D2. In this first embodiment, the kind of shape of an outline of the portion of wettable material 108 in said plane parallel to the surface 104 is substantially similar to the shape of the hole 100.

Moreover, in this first embodiment, D2 is higher than D1. Thus, a part 110 of the surface 104 between the hole 100 and the portion of wettable material 108 is not covered by the portion of wettable material 108 and is also completely surrounded by the portion of wettable material 108. However, it is possible to choose D2=D1.

In a variant embodiment, the hole 100 and/or the portion of wettable material 108 may have a different kind of shape chosen from rectangular, triangular, polygonal, or any other shape. The kind of shape of the portion of wettable material 108 may also be different from the kind of shape of the hole 100.

A portion of fuse material 112 is also made on and around the portion of wettable material 108. In this first embodiment, the shape of the portion of fuse material 112 is substantially similar to that of the portion of wettable material 108, but the dimensions of the portion of fuse material 112 are higher than those of the portion of wettable material 108. In the example of FIGS. 1A and 1B, the portion of fuse material 112 as deposited is ring-shaped with an inner diameter equal to D2. Hence, the portion of fuse material 112 also does not cover the part 110 of the surface 104 that is not covered by the portion of wettable material. An outer diameter of the portion of fuse material 112 is equal to D4 which is higher than D3. Alternately, it is possible that the portion of fuse material 112 has an inner diameter of value between D2 and D3 such that only a part of the portion of wettable material 108 is in contact with the portion of fuse material 112 and not completely covered by the portion of fuse material 112 as in FIGS. 1A and 1B. The portion of fuse material 112 also covers a second part 114 of the surface 104 which is located around the portion of wettable material 108.

The fuse material may be a pure metal like indium, tin, or an alloy like SnAgCu or AuSn for example.

A reflow of the portion of fuse material 112 is then carried out with a heat treatment of the portion of fuse material 112. The temperature at which this heat treatment is carried out is chosen according to the nature of the fuse material and corresponds to a temperature which is higher than the melting point of the fuse material. The reflow of the portion of fuse material 112 changes the shape of this portion 112 and creates a bump of fuse material 116 which has a shape corresponding substantially to a part of a sphere. This shape is obtained due to its minimal surface energy in liquid phase of the fuse material during the heat treatment. The fused material adheres only to the portion of wettable material 108 (see FIGS. 2A and 2B). The achieved bump of fuse material 116 forms a plug closing hermetically sealing the hole 100. The bump of fuse material 116 does not intrude into the hole and is thus located outside and above the hole 100 only. This reflowing may be carried out in a standard rapid thermal processing (RTP) equipment. As shown in FIG. 2B, the bump of fuse material 116 is, after reflow, in contact only with the portion of wettable material 108. But it is allowed and possible that the bump of fuse material 116 is also in contact with at least a portion of the part 110 of the surface 104 located between the hole 100 and the portion of wettable material 108 and/or with a part of the surface 104 located around the hole 100.

When the hole 100 communicates with a cavity intended to be hermetically closed, for example when the layer 102 corresponds to a wall of such a cavity, the reflow of the portion of fuse material 112 is advantageously is controlled in view of gas pressure, e.g. vacuum, and/or nature of gas (that is a pure gas or a mix of different gases like nitrogen or argon) in order to obtain a controlled atmosphere in the cavity after being hermetically closed by the plugging of the hole 100 by the bump 116. This reflow can also be done without flux to avoid trapping of organic or aggressive gases in the cavity. In this case, chemical treatments, for instance, based on fluoride gases or formic gas or hydrogen gas, are performed on the fuse material surface, that is the surface of the portion of fuse material 112, before the reflow step. Then, if the fuse material is kept out of oxidizing gases like air, the reflow can be done under neutral atmosphere or vacuum.

In the above-described example, the volume $V_1$ of the portion of fuse material 112 before reflow, that is as shown on FIGS. 1A and 1B is such that:

$$V_1 = \left(\pi\left(\frac{D4}{2}\right)^2 - \pi\left(\frac{D2}{2}\right)^2\right)Hm \quad (1)$$

with Hm corresponding to the thickness of the portion of fuse material 112.

After reflow, the volume $V_2$ of the bump 116 is such that:

$$V_2 \approx \frac{4}{3}\pi R^3 \quad (2)$$

with R corresponding to the radius of the sphere corresponding to the shape of the bump 116, when considering that the height H of the part the sphere formed by the bump 116 is approximately equal to the diameter of the sphere, that is when assuming that the height h of the remaining part of the sphere (shown with a dotted line in FIG. 2B) which is not formed by the bump 116 due to its flat bottom is such that h<<H.

As $V_1=V_2$, we have thus:

$$\left(\pi\left(\frac{D4}{2}\right)^2 - \pi\left(\frac{D2}{2}\right)^2\right)Hm \approx \frac{4}{3}\pi R^3 \quad (3)$$

$$\text{And thus } D4 \approx 2\sqrt{\frac{4}{3Hm} \times R^3 + \left(\frac{D2}{2}\right)^2} \quad (4)$$

For example, with a portion of fuse material deposited with a height of Hm=10 μm, an outer diameter of D4 and an inner diameter of D2=14 μm (with D1 for example between about 10 μm and 12 μm), it is possible to achieve a bump radius R dependent on outer diameter D4 as follows:

| D4 (μm) | R (μm) | D3 μm |
|---------|--------|-------|
| 22      | 8      | 16    |
| 27      | 10     | 20    |
| 33      | 12     | 24    |
| 45      | 15     | 30    |

Reference is now made to FIG. 3A to FIG. 3G which represent the steps of a method for hermetically sealing, or plugging, a hole with a fuse material according to a second embodiment. FIGS. 3A to 3G are cross-sectional side views.

Figure 3A:
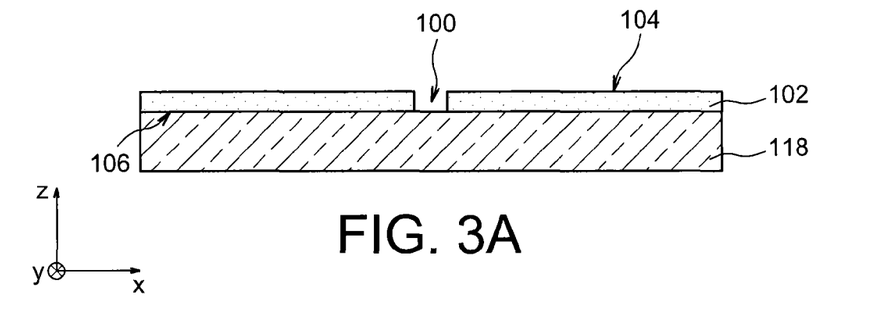
FIGS. 3A to 3G represent method steps of hermetically sealing a hole with a fuse material according to a second embodiment.

As shown in FIG. 3A, the hole 100 is made through the entire thickness of the layer 102 which is here $SiO_2$-based. The layer 102 is arranged over an element 118 which is here a silicon-based substrate. However, it is possible that the layer 102 is arranged over any other type of material or element 118.

Moreover, the hole 100 may communicate with an empty space (like another hole) or a cavity formed in and/or through the element 118. According to another variant, it is possible that the layer 102 and the element 118 correspond to a single layer. In this case, the hole 100 can be considered as made through a part of the thickness of this single layer.

Figure 3B:
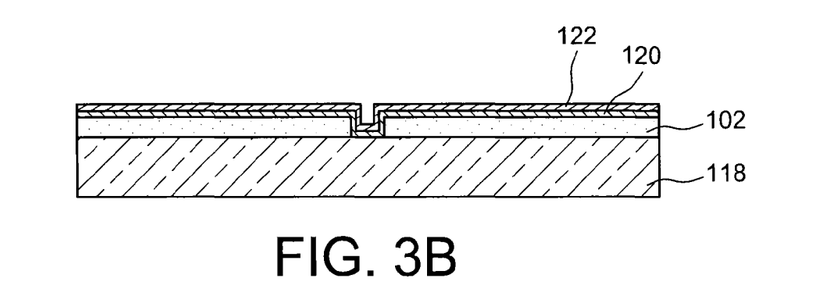

An adhesion layer 120, for example comprising Ti and having a thickness equal to 200 nm, is formed, here by deposition, on the surface 104 of the layer 102 and also at the walls (side walls and bottom wall) of the hole 100 (FIG. 3B). A layer of wettable material 122, for example, corresponding to a stack of a first Ni-based layer having a thickness equal to 300 nm and of a second Au-based layer having a thickness equal to 100 nm, is formed, for example by deposition, on the adhesion layer 120. The adhesion layer 120 improves the deposition of the layer of wettable material 122 but will also act as a seed layer for the applying of the portion of fuse material.

The wettable material of the layer 122 could be chosen from materials that are compatible with the fuse material intended to be used to plug the hole 100. For example, a stack made of Ni and Au, or a single gold-based or copper-based layer can be chosen as the wettable material if the fuse material corresponds to indium or an indium alloy or tin or a tin alloy. Other layer(s) could be arranged below the layer of wettable material 122 and/or the adhesion layer 120 for adhesion and/or reliability aspects.

Figure 3C:
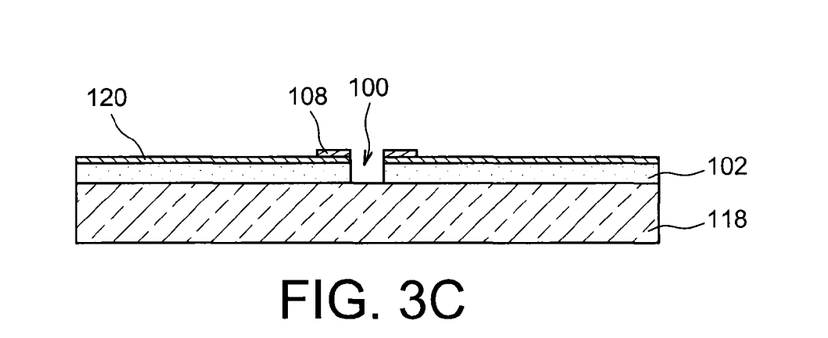

The layer of wettable material 122 is then patterned by etching such that remaining portion of this layer 122 forms the portion of wettable material 108 (FIG. 3C). The dimensions of the portion of wettable material 108 are chosen according to the size of the hole 100, and also according to the size of the bump intended to be made to plug hermetically the hole 100, as previously described. The parts of the adhesion layer 120 and of the layer of wettable material 122 which have been previously deposited in the hole 100, that is against side walls and the bottom wall of the hole 100, are also etched during this or a further etching step.

Alternately, the parts of the adhesion layer 120 and of the layer of wettable material 122 which have been previously deposited in the hole 100, that is against side walls and the bottom wall of the hole 100, may be first etched, and the layer of wettable material 122 may be then patterned by etching such that the remaining portion of this layer 122 forms the portion of wettable material 108.

As a variant, only the parts of the layer of wettable material 122 which are arranged in the hole 100 could be etched, and the parts of the adhesion layer 120 arranged against the side walls and/or the bottom wall of the hole 100 can be kept.

In all variants, all the wettable material is finally located outside the hole 100.

Figure 3D:
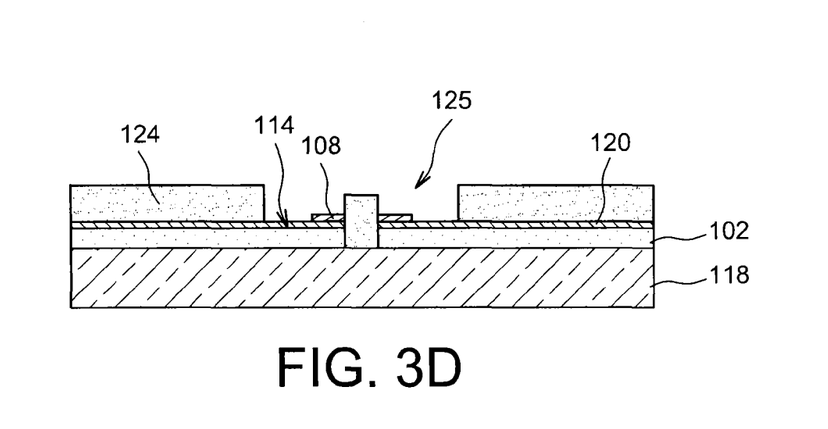

As shown in FIG. 3D, a photo resist layer 124 is deposited on the adhesion layer 120, on the portion of wettable material 108 and also in the hole 100, and then patterned by etching to define the deposition area of the fuse material. The resist material covering the portion of wettable material 108 and a portion of the adhesion layer 120 arranged above the second part 114 of the surface 104 which is located around the portion of wettable material 108 is removed by this patterning of the photo resist layer 124, thus forming an opening 125 in the photo resist layer 124 at the location of the portion of fuse material 112.

Figure 3E:
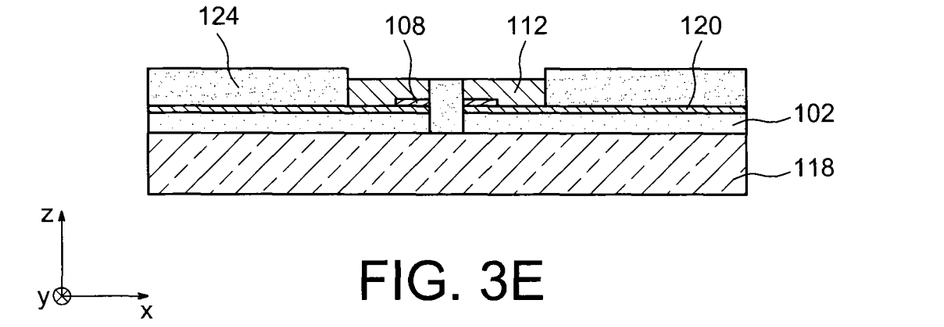
Figure 3F:
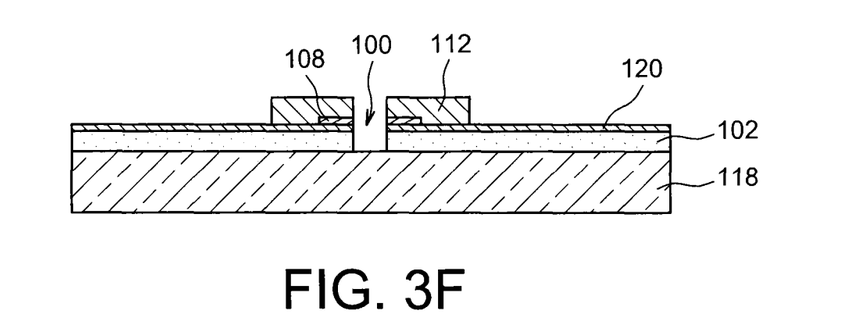

The portion of fuse material 112 is then formed by electro chemical process (ECD, or Electro Chemical Deposition) in the opening 125 previously made in the photo resist layer 124 (FIG. 3E). The adhesion layer 120 acts as a seed layer during this ECD. The growth of the fuse material is the same in all directions (axis X, Y and Z). The volume $V_1$ of the portion of fuse material 112 thus formed depends on the dimensions of the opening previously made in the photo resist layer 124.

In a variant embodiment, it is possible to make the portion of fuse material 112 by lift-off. In this case, the fuse material is first deposited in the opening previously made in the photo resist layer 112, but also on the photo resist layer 112. Deposition is done preferably by PVD sputtering to avoid contamination and also because such deposition is the most suitable for a lift-off process. The photo resist layer 122 is then removed such that only the fuse material deposited in the opening is kept, thus forming the portion of fuse material 112.

Whatever a process is used to apply the portion of fuse material 112, the location of this portion of fuse material 112 on and next to the portion of wettable material 108 enables to obtain a portion 112 which extends essentially horizontal, that is which has its main dimensions within a plane parallel to the surface onto which the portion 112 is applied. Thus the obtained portion 112 is mechanically stable. This applies for all the embodiments and variants described in this application.

Figure 3G:
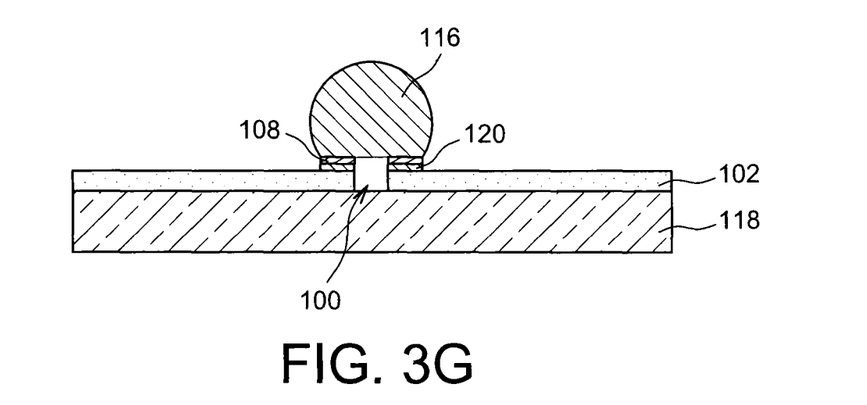

Once the portion of fuse material 112 is formed, the photo resist layer 124 is removed (FIG. 3F) and the reflow of the fuse material is carried out as previously described in relation with FIGS. 1A to 2B. A bump 116 of fuse material hermetically plugging the hole 100 is thus obtained on the portion of wettable material 108 and above the hole 100 but not inside the hole 100. Finally, parts of the adhesion layer 120 not covered by the portion of wettable material 108 and/or by the bump of fuse material 116 are removed by etching (FIG. 3G).

It is also possible to remove these parts of the adhesion layer 120 before the reflow of the fuse material.

Reference is now made to FIG. 4A to FIG. 4H which represent the steps of a method for hermetically sealing, or plugging, a hole with a fuse material according to a third embodiment. FIGS. 4A to 4H are cross-sectional side views.

Figure 4A:
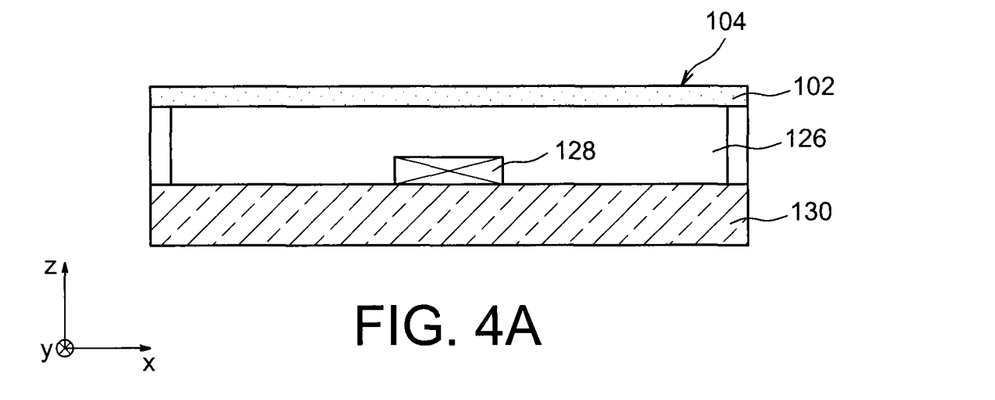
FIGS. 4A to 4H represent steps of a method of hermetically sealing a hole with a fuse material according to a third embodiment.

As shown in FIG. 4A, the layer 102 through which the hole 100 is intended to be made corresponds to a wall, here a cap or a lid, of a cavity 126 in which a microelectronic device 128, e.g. a MEMS device, is encapsulated. The microelectronic device 128 is arranged on a carrier, e.g. a support wafer 130.

Figure 4B:
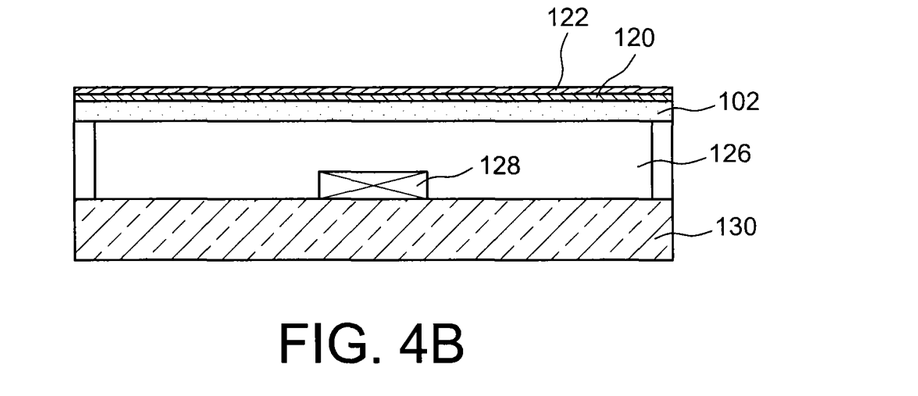

As in the second embodiment, the adhesion layer 120 is formed, here by deposition, on the surface 104 of the layer 102 (FIG. 4B). The layer of wettable material 122 is formed, for example by deposition, on the adhesion layer 120. The adhesion layer 120 and the layer of wettable material 122 may be similar as those previously described in relation with the second embodiment. Other layer(s) could be arranged below the layer of wettable material 122 and/or the adhesion layer 120 for adhesion and/or reliability aspects.

Figure 4C:
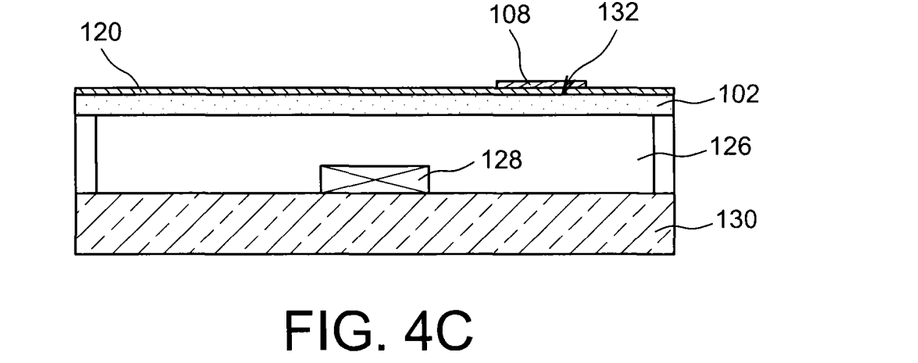

As shown in FIG. 4C, the layer of wettable material 122 is then patterned by etching such that a remaining portion of this layer 122 corresponds to the portion of wettable material 108. The portion of wettable material 108 here covers a first part 132 of the surface 104 corresponding to the location of the hole 100 intended to be made through the layer 102 and also another part of the surface 104 around this first part 132 corresponding to the location of the portion of wettable material 108 once the hole 100 will be made.

Figure 4D:
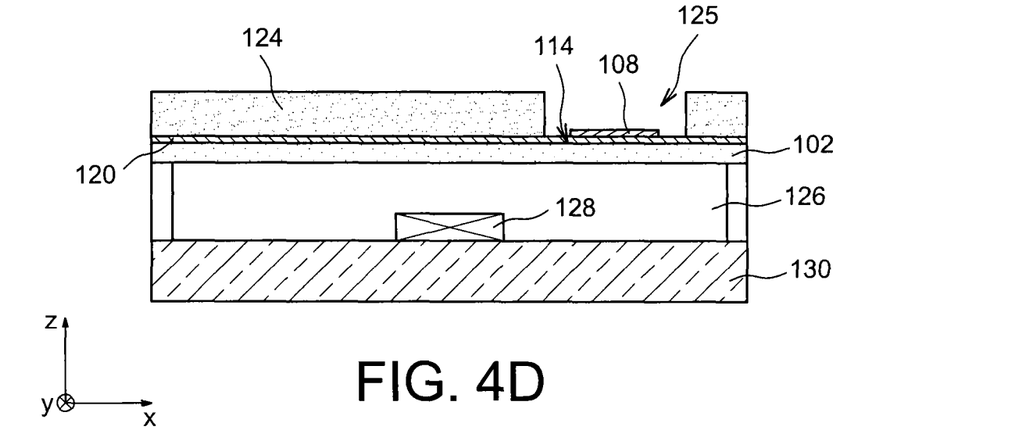

The photo resist layer 124 is then deposited on the adhesion layer 120 and on the portion of wettable material 108, and patterned by etching to define the deposition area of the fuse material (FIG. 4D). The resist material covering the portion of wettable material 108 and a portion of the adhesion layer 120 arranged above the second part 114 of the surface 104 which is located around the portion of wettable material 108 is removed by this patterning of the photo resist layer 124, thus forming the opening 125 in the photo resist layer 124 corresponding to the location of the portion of fuse material 112.

Figure 4E:
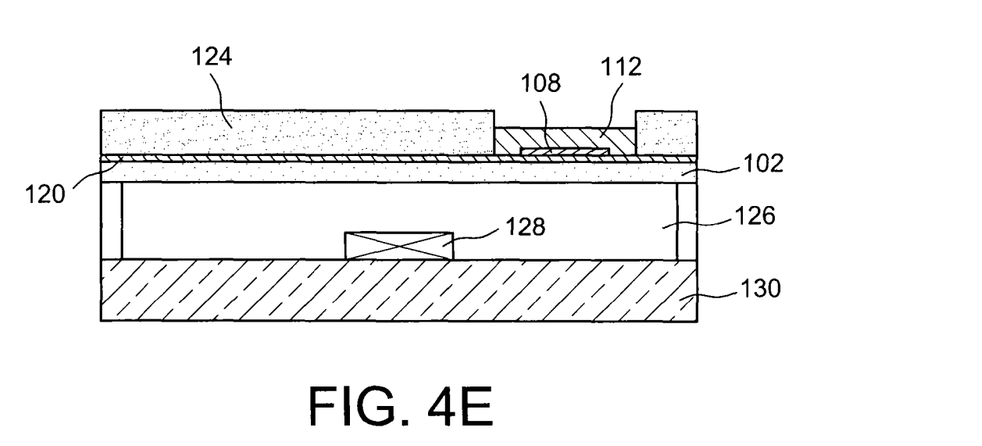

As shown in FIG. 4E, the portion of fuse material 112 is then formed in the opening 125 previously made in the photo resist layer 124, like in the second embodiment. Alternately, it is possible to make the portion of fuse material 112 by lift-off.

Figure 4F:
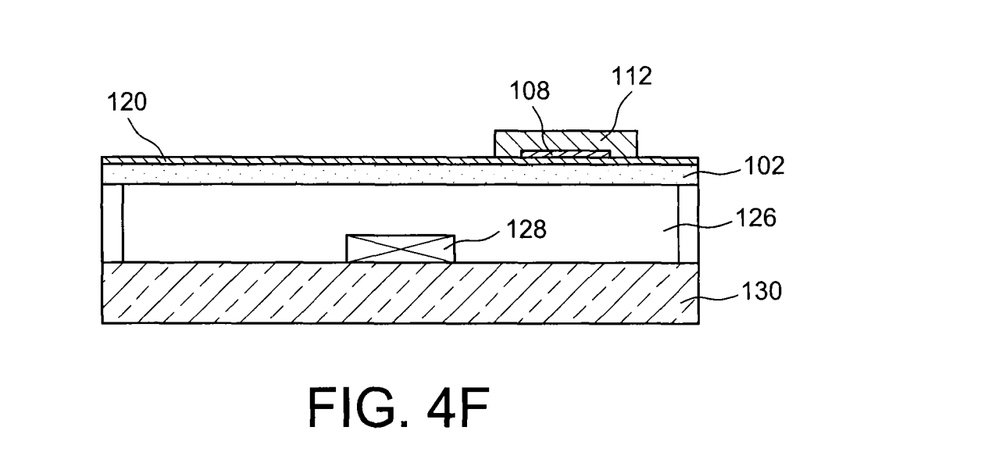

Once the portion of fuse material 112 is formed, the photo resist layer 124 is removed (FIG. 4F).

Figure 4G:
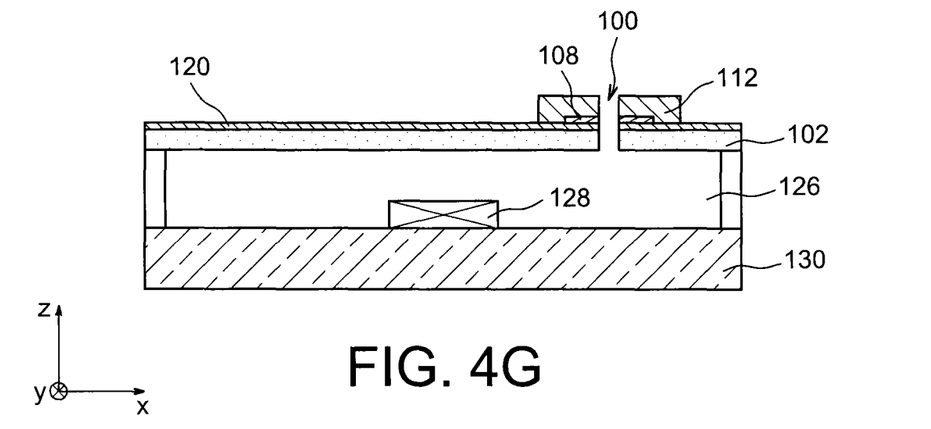

As shown in FIG. 4G, hole 100 is etched through the portion of fuse material 112, the portion of wettable material 108, the adhesion layer 120 and the capping layer 102. The hole 100 thus forms an access to the cavity 126.

Figure 4H:
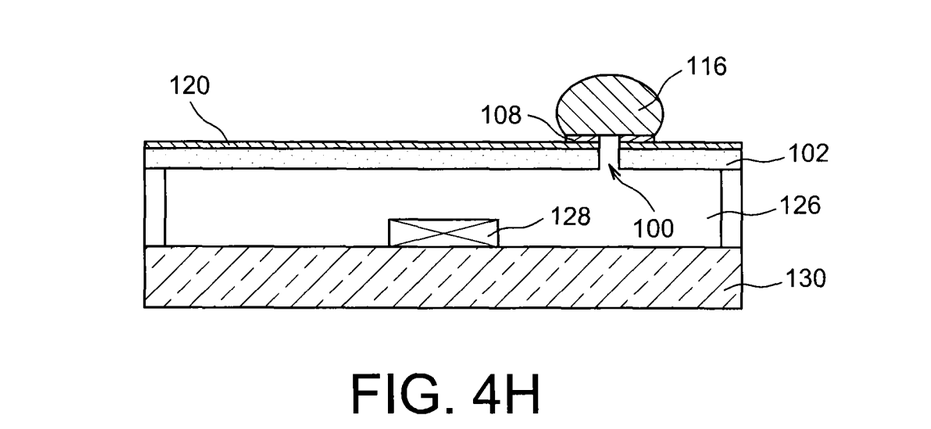

Finally, as shown in FIG. 4H, the reflow of the fuse material is carried out as previously described in relation with FIGS. 1A to 2B. The bump 116 of fuse material hermetically plugging the hole 100 is thus obtained on the portion of wettable material 108 and above the hole 100. As no wettable material is located inside the hole 100, the bump of fuse material 116 is also located only outside the hole 100. Here the reflow is carried out under a controlled atmosphere in order to obtain the same pressure and the same gas or gases in the cavity 126 after hermetically plugging the hole 100.

As in the second embodiment, it is possible that parts of the adhesion layer 120 not covered by the portion of wettable material 108 and/or by the bump of fuse material 116 are etched. It is also possible to remove these parts of the adhesion layer 120 before the reflow of the fuse material.

Figure 5:
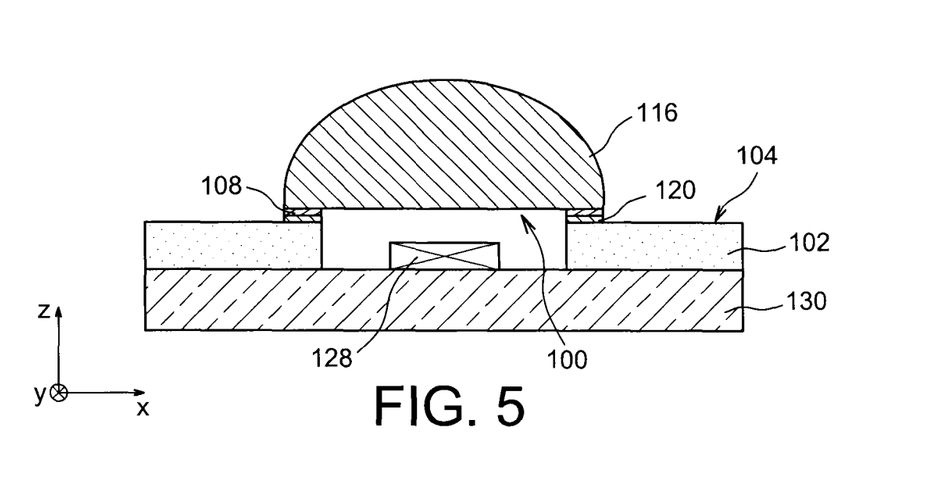
FIG. 5 represents a packaging structure obtained with a method of hermetically sealing a hole with a fuse material according to a fourth embodiment.

FIG. 5 represents a packaging structure obtained with a method of hermetically sealing a hole with a fuse material according to a fourth embodiment.

The hole 100 is made through layer 102. The side walls of the hole 100 are forming the side walls of a cavity in which the microelectronic device 128, e.g. a MEMS device, is placed to get encapsulated. The microelectronic device 128 is arranged on the support wafer 130. Moreover, the hole 100 corresponds to the cavity in which the microelectronic device 128 is arranged. The dimensions of the cavity (e.g., a diameter when the hole 100 is circular) in the plane of the surface 104 are, for example, equal to 10 and the height of the cavity, that is the thickness of the layer 102, is, for example, between around 2 μm et 10 μm. The cap of this cavity is formed by the bump of fuse material 116 which plugs the hole 100, this bump being located outside the hole 100. In the example described here, the bump of fuse material 116 is fastened only to the portion of wettable material 108 located outside the hole 100 because of its good adhesion to the wettable material. In such embodiment, if the microelectronic device 128 is a MOEMS or a NOEMS device, the support wafer 130 may be transparent to at least a selected range of wavelengths intended to be received and/or emitted by the microelectronic device 128.

Figure 7A:
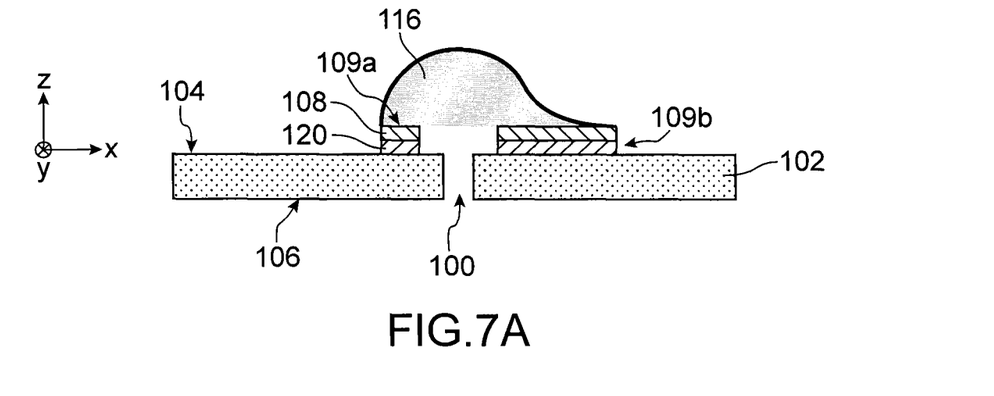
Figure 7B:
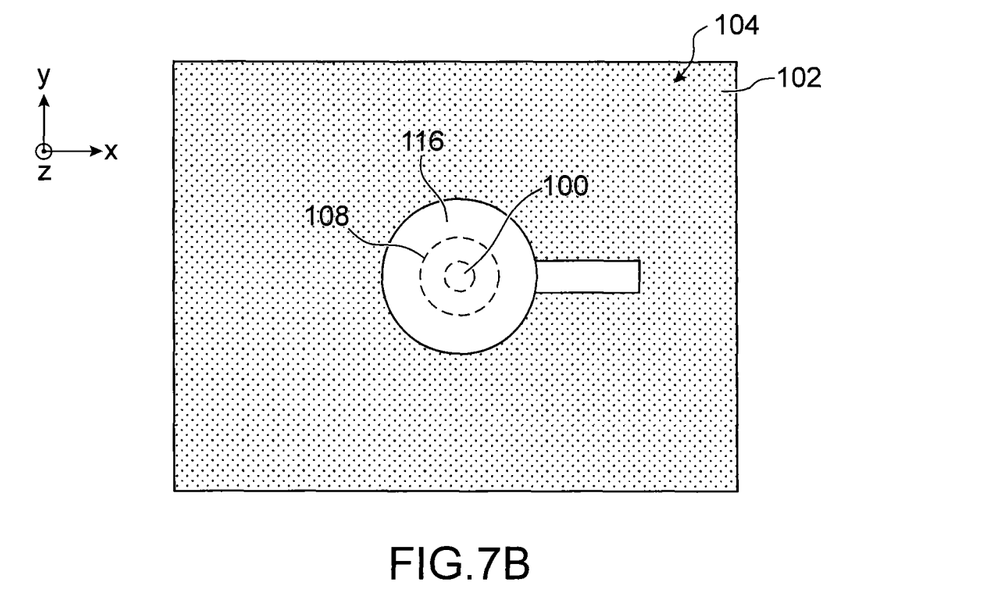

Reference is made to FIGS. 6A to 7B which represent the steps of a method of hermetically sealing, or plugging, a hole with a fuse material according to a fifth embodiment. FIGS. 6B and 7B are top views and FIGS. 6A and 7A are cross-sectional side views.

In this fifth embodiment, the portion of wettable material 108 and the portion of adhesion layer 120 comprise a first part 109*a* whose shape, in a plane parallel to the surface 104, corresponds to a ring arranged around the hole 100 and a second part 109*b* adjacent to the first part 109*a*. In the example shown in FIGS. 6A and 6B, the second part 109*b* of the portions 108 and 120 is connected to the first part 109*a* and has an elongated, for example a rectangular shape in the plane parallel to the surface 104.

The portion of fuse material 112 has a first part 111*a* partially covering the first part 109*a* of the portions 108, 120 and also covering an area next to this first part 109*a*. The shape of the first part 111*a*, in the plane parallel to the surface 104, corresponds to a segment of a ring which has a gap. The portion of fuse material 112 has also a second part 111*b* covering the second part 109*b* of the portion of wettable material and an area next to the second part 109*b*. The shape of the second part 111*b*, in the plane parallel to the surface 104, is e.g. rectangular. As a variant, the parts 109*b* and 111*b* may have a shape different than a rectangular shape.

A reflow of the portion of fuse material 112 is then carried out, thus forming a bump of fuse material 116 fastened only to the portion of wettable material 108, and more particularly to both portions 109*a* and 109*b* of the portion of wettable material 108 (FIGS. 7A and 7B). The bump of fuse material 116 corresponds to an homogeneous portion of fuse material plugging the hole 100. A first part of the bump 116 is located above the portion 109*a*, and a second part of the bump 116 is located above the portion 109*b*.

In this fifth embodiment, an excess of fuse material is deposited at one side of the hole 100 (see FIGS. 6A, 6B in which the excess of fuse material is arranged on the side comprising the part 109*b*). During the reflow, this excess of fuse material fills the gap in the fuse material at the other side of the hole 100, thus forming the bump 116 which is centered above the hole 100. The portion of wettable material 108 is continuous around the hole 100, but the portion 112 deposited before the reflow is not a ring closed around the hole 100, but has a gap and is in contact with the wettable material.

In all the previously described embodiments, one portion of fuse material 112 is made on the portion of wettable material 108 and on the second part 114 of the surface 104. However, in all these embodiments, it is possible to apply several individual and separated portions of fuse material 112 on the portion of wettable material 108 and on the second part 114 of the surface 104. In this case, during the reflowing of these portions of fuse material, the reflowed fuse material of these portions aggregate and form the bump 116 of fuse material. Further it is possible to hermetically plug and seal in parallel a multitude of holes made in the same of different layers 102. Further, it is possible to proceed in parallel a multitude of devices that may be arranged on or formed in a wafer.

The invention claimed is:

1. A method of hermetically sealing a hole in a surface of a layer with a fuse material, comprising at least the following steps:
    applying a wettable material on an area of the surface such that the wettable material completely surrounds the hole in the surface and all the wettable material is located outside the hole, or such that the wettable material completely surrounds a first part of said surface corresponding to a location of the hole and all the wettable material is located outside said location of the hole;
    applying the fuse material on at least a part of the wettable material, and on a second part of said surface adjacent or around the wettable material such that a part of the fuse material is arranged next to the wettable material and is in contact with the wettable material, wherein a volume of the fuse material corresponds to a volume of a bump of fuse material configured to hermetically plug the hole;
    reflowing the fuse material, thereby forming the bump of fuse material having a shape corresponding to a part of a sphere, being fastened only to the wettable material and not being fastened to the surface, thereby hermetically plugging the hole;
    wherein the hole is made in or through at least said layer before the reflowing of the fuse material.

2. The method according to claim 1, wherein the shape or the planar cross section of the wettable material and/or the shape of the of fuse material are chosen from the shapes circular, polygonal, slit-shaped, and an asymmetric form,
    and/or are not centered on the hole,
    and/or made of different shapes merged together, wherein the shape of the hole in a plane parallel to said surface is circular, polygonal or slit-shaped or not of a symmetric form.

3. The method according to claim 1, wherein the reflowing of the fuse material is carried out at a controlled atmosphere such that after the reflowing of the portion of fuse material and plugging the hole, the controlled atmosphere corresponds to a sealed atmosphere at least in the hole.

4. The method according to claim 1, wherein applying the wettable material comprises the following steps:
    deposition of a layer of wettable material on said surface;
    etching a part of the layer of wettable material such that a remaining portion of the layer of wettable material corresponds to the applied wettable material.

5. The method according to claim 4, wherein an adhesion layer is first deposited on said surface before the deposition of the layer of wettable material which is then deposited on said adhesion layer.

6. The method according to claim 5, wherein the fuse material is applied by electro-chemical deposition, the adhesion layer forming a seed layer for the growth of the fuse material during the electro-chemical deposition.

7. The method according to claim 1, wherein applying the fuse material comprises the following steps:
    deposition of a photo resist layer on said surface and on the wettable material;
    etching a part of the photo resist layer to form an opening through the photo resist layer;
    and wherein the fuse material is then formed in said opening by deposition into said opening, and wherein the photo resist layer is removed after deposition of the fuse material.

8. The method according to claim 1, wherein said surface corresponds to a main surface of a layer, and wherein the hole is made through at least a part of the thickness of the layer.

9. The method according to claim 8, wherein said layer through which the hole is made corresponds to a wall of a cavity in which at least one microelectronic device is encapsulated, and/or to a membrane covering or closing a cavity or a cap enclosing the cavity.

10. The method according to claim 9, wherein the hole corresponds to a cavity in which at least one microelectronic device is encapsulated, and wherein the bump of fuse material forms a wall of the cavity.

11. A method of hermetically sealing a hole in a surface of a layer with a fuse material, comprising at least the following steps:
    applying a portion of a wettable material on an area of the surface such that the portion of wettable material completely surrounds the hole made through said surface and that all the wettable material is located outside the hole, or such that the portion of wettable material completely surrounds a first part of said surface corresponding to a location of the hole;
    applying at least a portion of the fuse material on at least a part of the portion of wettable material, and on at least a second part of said surface adjacent or around the portion of wettable material such that a part of the portion of fuse material is arranged next to the portion of wettable material and is in contact with the portion of wettable material, wherein a volume of the portion of fuse material corresponds to a volume of a bump of fuse material intended to hermetically plug the hole;
    reflowing the portion of fuse material, thereby forming the bump of fuse material having a shape corresponding to a part of a sphere, being fastened only to the portion of wettable material and hermetically plugging the hole;
    wherein the hole is made in or through at least said layer before the reflowing of the portion of fuse material;
    wherein applying the portion of fuse material comprises the following steps:
    deposition of a photo resist layer on said surface and on the wettable material;
    etching a part of the photo resist layer to form an opening through the photo resist layer;
    and wherein the portion of fuse material is then formed in said opening by deposition into said opening, and wherein the photo resist layer is removed after deposition of the portion of fuse material.

12. The method according to claim 11, wherein the shape or the planar cross section of the wettable material and/or the shape of the fuse material are chosen from the shapes circular, polygonal, slit-shaped, and an asymmetric form,
    and/or are not centered on the hole,
    and/or made of different shapes merged together, wherein the shape of the hole in a plane parallel to said surface is circular, polygonal or slit-shaped or not of a symmetric form.

13. The method according to claim 11, wherein the reflowing of the portion of fuse material is carried out at a controlled atmosphere such that after the reflowing of the portion of fuse material and plugging the hole, the controlled atmosphere corresponds to a sealed atmosphere at least in the hole.

14. The method according to claim 11, wherein applying the portion of wettable material comprises the following steps:
   deposition of a layer of wettable material on said surface;
   etching a part of the layer of wettable material such that a remaining portion of the layer of wettable material corresponds to the portion of wettable material.

15. The method according to claim 14, wherein an adhesion layer is first deposited on said surface before the deposition of the layer of wettable material which is then deposited on said adhesion layer.

16. The method according to claim 15, wherein the fuse material is applied by electro-chemical deposition, the adhesion layer forming a seed layer for the growth of the fuse material during the electro-chemical deposition.

17. The method according to claim 11, wherein said surface corresponds to a main surface of a layer, and wherein the hole is made through at least a part of the thickness of the layer.

18. The method according to claim 11, wherein said layer through which the hole is made corresponds to a wall of a cavity in which at least one microelectronic device is encapsulated, and/or to a membrane covering or closing a cavity or a cap enclosing the cavity.

19. The method according to claim 18, wherein said layer through which the hole is made corresponds to a wall of a cavity in which at least one microelectronic device is encapsulated, and/or to a membrane covering or closing a cavity or a cap enclosing the cavity.

* * * * *